(12) United States Patent
Chai

(10) Patent No.: US 11,152,070 B2
(45) Date of Patent: Oct. 19, 2021

(54) MEMORY DEVICE INCLUDING PAGE BUFFER AND METHOD OF OPERATING THE MEMORY DEVICE

(71) Applicant: SK hynix Inc., Icheon-si (KR)

(72) Inventor: Soo Yeol Chai, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/890,574

(22) Filed: Jun. 2, 2020

(65) Prior Publication Data

US 2021/0183447 A1    Jun. 17, 2021

(30) Foreign Application Priority Data

Dec. 11, 2019   (KR) ........................ 10-2019-0164942

(51) Int. Cl.
| | |
|---|---|
| *G11C 16/10* | (2006.01) |
| *G11C 16/04* | (2006.01) |
| *G11C 16/24* | (2006.01) |
| *G11C 16/26* | (2006.01) |
| *G11C 16/30* | (2006.01) |
| *G11C 11/56* | (2006.01) |
| *G11C 16/08* | (2006.01) |

(52) U.S. Cl.
CPC .......... *G11C 16/10* (2013.01); *G11C 16/0483* (2013.01); *G11C 16/24* (2013.01); *G11C 16/26* (2013.01); *G11C 16/30* (2013.01); *G11C 11/5621* (2013.01); *G11C 16/08* (2013.01)

(58) Field of Classification Search
CPC ......... G11C 16/10; G11C 16/30; G11C 16/24; G11C 16/0483; G11C 16/26; G11C 16/08; G11C 11/5621
See application file for complete search history.

(56) References Cited

U.S. PATENT DOCUMENTS

| | | | |
|---|---|---|---|
| 10,102,910 B2 * | 10/2018 | Lee .................. | G11C 16/26 |
| 2012/0026797 A1 * | 2/2012 | Kim .................. | G11C 16/24 365/185.18 |

FOREIGN PATENT DOCUMENTS

| | | |
|---|---|---|
| KR | 101591033 B1 | 2/2016 |
| KR | 1020160062498 A | 6/2016 |
| KR | 101842322 B1 | 3/2018 |

* cited by examiner

*Primary Examiner* — David Lam
(74) *Attorney, Agent, or Firm* — William Park & Associates Ltd.

(57) ABSTRACT

The present disclosure relates to a memory device. The memory device includes first memory cell strings, second memory cell strings, a peripheral circuit, and a control logic. The peripheral circuit is connected to first drain select transistors of each of the first memory cell strings through first bit lines, and is connected to second drain select transistors of each of the second memory cell strings through second bit lines. The control logic controls the peripheral circuit to increase a potential of a program inhibit bit line among the first bit lines to a first voltage, and float the program inhibit bit line and increase a potential of the second bit line to a second voltage after the potential of the program inhibit bit line increases to the first voltage.

25 Claims, 12 Drawing Sheets

MEMORY DEVICE INCLUDING PAGE BUFFER AND METHOD OF OPERATING THE MEMORY DEVICE

CROSS-REFERENCE TO RELATED APPLICATION

The present application claims priority under 35 U.S.C. § 119(a) to Korean patent application number 10-2019-0164942, filed on Dec. 11, 2019, in the Korean Intellectual Property Office, the entire disclosure of which is incorporated herein by reference.

BACKGROUND

1. Technical Field

The present disclosure relates to an electronic device, and more particularly, to a memory device and a method of operating the memory device.

2. Related Art

A storage device is a device that stores data under control of a host device such as a computer or a smartphone. A storage device may include a memory device in which data is stored and a memory controller controlling the memory device. The memory device is divided into a volatile memory device and a non-volatile memory device.

The volatile memory device is a device that stores data only when power is supplied and loses the stored data when the power supply is cut off. The volatile memory device includes a static random access memory (SRAM), a dynamic random access memory (DRAM), and the like.

The non-volatile memory device is a device that does not lose data even though power is cut off. The non-volatile memory device include a read only memory (ROM), a programmable ROM (PROM), an electrically programmable ROM (EPROM), an electrically erasable and programmable ROM (EEPROM), a flash memory, and the like.

SUMMARY

A memory device according to an embodiment of the present disclosure may include first memory cell strings, second memory cell strings, a peripheral circuit, and a control logic. The peripheral circuit may be connected to first drain select transistors of each of the first memory cell strings through first bit lines, and is connected to second drain select transistors of each of the second memory cell strings through second bit lines. The control logic may control the peripheral circuit to increase a potential of a program inhibit bit line among the first bit lines to a first voltage, and float the program inhibit bit line and increase a potential of the second bit line to a second voltage after the potential of the program inhibit bit line increases to the first voltage.

A method of operating a memory device including first memory cell strings and second memory cell strings according to an embodiment of the present disclosure may include increasing a potential of a program inhibit bit line among first bit lines connected to first drain select transistors of each of the first memory cell strings to a first voltage, floating the program inhibit bit line, and increasing a potential of second bit lines connected to second drain select transistors of each of the second memory cell strings to a second voltage.

A memory device according to an embodiment of the present disclosure may include first memory cell strings, second memory cell strings, a peripheral circuit, and a control logic. The peripheral circuit may be connected to first drain select transistors of each of the first memory cell strings through first bit lines, and may be connected to second drain select transistors of each of the second memory cell strings through second bit lines. The control logic may control the peripheral circuit to increase a potential of a program inhibit bit line among the first bit lines from a first voltage to a third voltage by increasing the potential of the program inhibit bit line to the first voltage and increasing the potential of the second bit lines to a second voltage.

DETAILED DESCRIPTION

Hereinafter, an embodiment of the present disclosure will be described with reference to the accompanying drawings.

An embodiment of the present disclosure provides a memory device having channel boosting performance and a method of operating the same.

According to the present technology, the memory device may have improved channel boosting performance and a method of operating the memory device may provide improved channel boosting performance.

Figure 1:
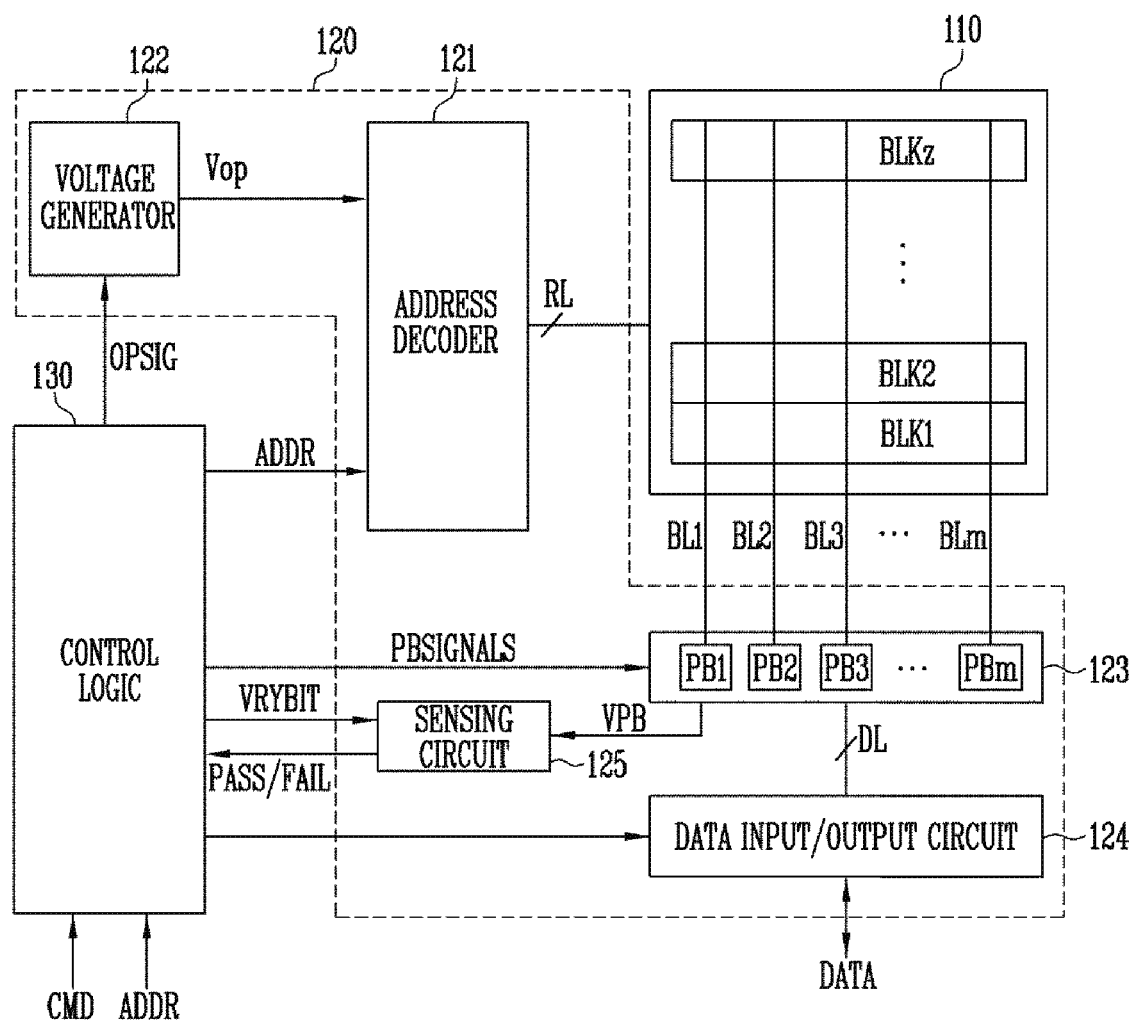
FIG. 1 is a diagram for describing a structure of a memory device according to an embodiment of the present disclosure.

FIG. 1 is a diagram for describing a structure of a memory device according to an embodiment of the present disclosure.

Referring to FIG. 1, a memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to an address decoder 121 through row lines RL. The plurality of memory blocks BLK1 to BLKz are connected to a read and write circuit 123 through bit lines BL1 to BLm. Each of the plurality of memory blocks BLK1 to BLKz includes a plurality of memory cells. As an embodiment, the plurality of memory cells are non-volatile memory cells. Memory cells connected to the same word line among the plurality of memory cells are defined as one physical page. That is, the memory cell array 110 is configured of a plurality of physical pages. According to an embodiment of the present disclosure, each of the plurality of memory blocks BLK1 to BLKz included in the memory cell array 110 may include a plurality of dummy cells. At least one of the dummy cells may be connected in series between a drain select transistor and the memory cells and between a source select transistor and the memory cells.

Each of the memory cells of the memory device 100 may be configured as a single level cell (SLC) that stores one data bit, a multi-level cell (MLC) that stores two data bits, a triple level cell (TLC) that stores three data bits, or a quad level cell (QLC) that stores four data bits.

The peripheral circuit 120 may include an address decoder 121, a voltage generator 122, the read and write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is connected to the memory cell array 110 through the row lines RL. The row lines RL may include drain select lines, word lines, source select lines, and a common source line. According to an embodiment of the present disclosure, the word lines may include normal word lines and dummy word lines. According to an embodiment of the present disclosure, the row lines RL may further include a pipe select line.

The address decoder 121 is configured to operate in response to control of the control logic 130. The address decoder 121 receives an address ADDR from the control logic 130.

The address decoder 121 is configured to decode a block address of the address ADDR. The address decoder 121 selects at least one memory block among the memory blocks BLK1 to BLKz according to the decoded block address. The address decoder 121 is configured to decode a row address RADD of the received address ADDR. The address decoder 121 may select at least one word line of a selected memory block by applying voltages supplied from the voltage generator 122 to at least one word line WL according to the decoded row address RADD.

During the program operation, the address decoder 121 may apply a program voltage to a selected word line and apply a pass voltage having a level less than that of the program voltage to unselected word lines. During a program verify operation, the address decoder 121 may apply a verify voltage to the selected word line and apply a verify pass voltage having a level greater than that of the verify voltage to the unselected word lines.

During the read operation, the address decoder 121 may apply a read voltage to the selected word line and apply a read pass voltage having a level greater than that of the read voltage to the unselected word lines.

According to an embodiment of the present disclosure, the erase operation of the memory device 100 is performed in memory block units. The address ADDR input to the memory device 100 during the erase operation includes a block address. The address decoder 121 may decode the block address and select one memory block according to the decoded block address. During the erase operation, the address decoder 121 may apply a ground voltage to the word lines input to the selected memory block.

According to an embodiment of the present disclosure, the address decoder 121 may be configured to decode a column address of the transferred address ADDR. The decoded column address may be transferred to the read and write circuit 123. As an example, the address decoder 121 may include a component such as a row decoder, a column decoder, and an address buffer.

The voltage generator 122 is configured to generate a plurality of operation voltages Vop by using an external power voltage supplied to the memory device 100. The voltage generator 122 operates in response to the control of the control logic 130.

As an embodiment, the voltage generator 122 may generate an internal power voltage by regulating the external power voltage. The internal power voltage generated by the voltage generator 122 is used as an operation voltage of the memory device 100. In an embodiment, the internal power voltage generated by the voltage generator 122 may be used to generate an operation voltage of the memory device 100.

As an embodiment, the voltage generator 122 may generate the plurality of operation voltages Vop using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of selection read voltages, and a plurality of non-selection read voltages.

In order to generate the plurality of operation voltages Vop having various voltage levels, the voltage generator 122 may include a plurality of pumping capacitors that receive the internal voltage and selectively activate the plurality of pumping capacitors to generate the plurality of operation voltages Vop.

The plurality of generated operation voltages Vop may be supplied to the memory cell array 110 by the address decoder 121.

The read and write circuit 123 includes first to m-th page buffers PB1 to PBm. The first to m-th page buffers PB1 to PBm are connected to the memory cell array 110 through first to m-th bit lines BL1 to BLm, respectively. The first to m-th page buffers PB1 to PBm operate in response to the control of the control logic 130.

The first to m-th page buffers PB1 to PBm communicate data DATA with the data input/output circuit 124. At a time of program, the first to m-th page buffers PB1 to PBm receive the data DATA to be stored through the data input/output circuit 124 and data lines DL.

During the program operation, when a program voltage is applied to the selected word line, the first to m-th page buffers PB1 to PBm may transfer the data DATA to be stored, that is, the data DATA received through the data input/output circuit 124 to the selected memory cells through the bit lines BL1 to BLm. The memory cells of the selected page are programmed according to the transferred data DATA. A memory cell connected to a bit line to which a program permission voltage (for example, a ground voltage) is applied may have an increased threshold voltage. A threshold voltage of a memory cell connected to a bit line to which a program inhibition voltage (for example, a power voltage) is applied may be maintained. During the program verify operation, the first to m-th page buffers PB1 to PBm read the data DATA stored in the memory cells from the selected memory cells through the bit lines BL1 to BLm.

During the read operation, the read and write circuit 123 may read the data DATA from the memory cells of the selected page through the bit lines BL and store the read data DATA in the first to m-th page buffers PB1 to PBm.

During the erase operation, the read and write circuit 123 may float the bit lines BL. As an embodiment, the read and write circuit 123 may include a column selection circuit.

The data input/output circuit 124 is connected to the first to m-th page buffers PB1 to PBm through the data lines DL. The data input/output circuit 124 operates in response to the control of the control logic 130.

The data input/output circuit 124 may include a plurality of input/output buffers (not shown) that receive input data DATA. During the program operation, the data input/output circuit 124 receives the data DATA to be stored from an external controller (not shown). During the read operation, the data input/output circuit 124 outputs the data DATA transferred from the first to m-th page buffers PB1 to PBm included in the read and write circuit 123 to the external controller.

During the read operation or the verify operation, the sensing circuit 125 may generate a reference current in response to a signal of a permission bit VRYBIT generated by the control logic 130 and may compare a sensing voltage VPB received from the read and write circuit 123 with a reference voltage generated by the reference current to output a pass signal or a fail signal to the control logic 130.

The control logic 130 may be connected to the address decoder 121, the voltage generator 122, the read and write circuit 123, the data input/output circuit 124, and the sensing circuit 125. The control logic 130 may be configured to control all operations of the memory device 100. The control logic 130 may operate in response to a command CMD transferred from an external device.

The control logic 130 may generate various signals in response to the command CMD and the address ADDR to control the peripheral circuit 120. For example, the control logic 130 may generate an operation signal OPSIG, the row address RADD, a read and write circuit control signal PBSIGNALS, and the permission bit VRYBIT in response to the command CMD and the address ADDR. The control logic 130 may output the operation signal OPSIG to the voltage generator 122, output the row address RADD to the address decoder 121, output the read and write control signal to the read and write circuit 123, and output the permission bit VRYBIT to the sensing circuit 125. In addition, the control logic 130 may determine whether the verify operation is passed or failed in response to the pass or fail signal PASS/FAIL output by the sensing circuit 125.

In an embodiment, the memory cell array 110 may include first memory cell strings and second memory cell strings. The peripheral circuit 120 may be connected to first drain select transistors of each of the first memory cell strings through first bit lines, and may be connected to second drain select transistors of each of the second memory cell strings through second bit lines.

The control logic 130 may control the peripheral circuit 120 to perform a bit line setup operation and a program pulse application operation to program the first drain select transistors.

The control logic 130 may control the peripheral circuit 120 to increase a potential of a program inhibit bit line among the first bit lines to a first voltage. The control logic 130 may control the peripheral circuit 120 to float the program inhibit bit line after the potential of the program inhibit bit line increases to the first voltage. The control logic 130 may control the peripheral circuit 120 to increase a potential of the second bit lines to a second voltage when the program inhibit bit line is floated. While the potential of the second bit lines adjacent to the floated program inhibit bit line increases, the potential of the program inhibit bit line may increase to a third voltage by a bit line coupling effect.

That is, the control logic 130 may control the peripheral circuit 120 to increase the potential of the program inhibit bit line to the third voltage while the potential of the second bit lines increases to the second voltage.

The third voltage may be determined based on the first voltage and the second voltage. For example, a third voltage value may be a value obtained by adding a value obtained by multiplying a second voltage value by a bit line coupling coefficient and a first voltage value. An increase of the potential of the program inhibit bit line by the bit line coupling effect will be described with reference to FIG. 9.

Figure 2:
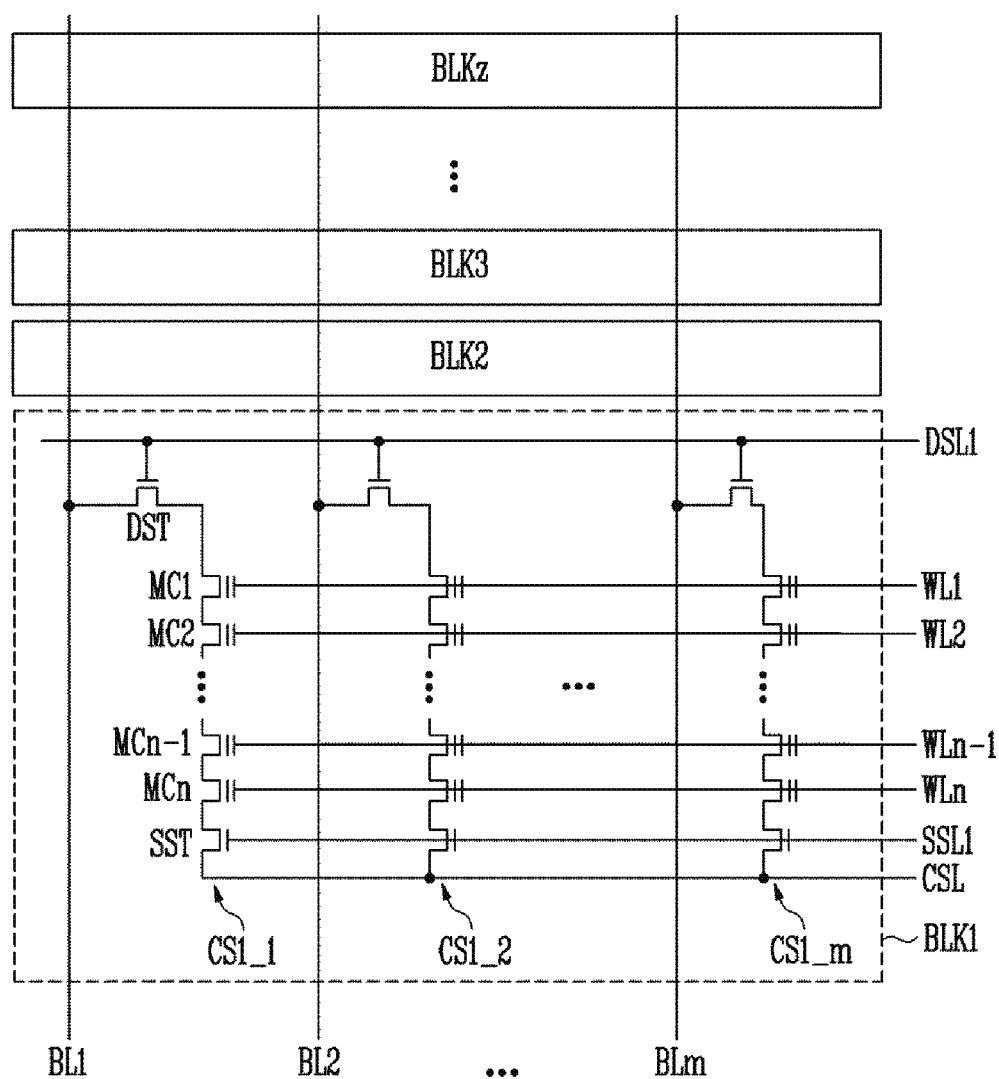
FIG. 2 is a diagram for describing an embodiment of a memory cell array of FIG.

FIG. 2 is a diagram for describing an embodiment of the memory cell array of FIG.

Referring to FIG. 2, the first to z-th memory blocks BLK1 to BLKz are commonly connected to the first to m-th bit lines BL1 to BLm. In FIG. 2, for convenience of description, elements included in the first memory block BLK1 of the plurality of memory blocks BLK1 to BLKz are shown, and elements included in each of the remaining memory blocks BLK2 to BLKz are omitted. It will be understood that each of the remaining memory blocks BLK2 to BLKz is configured similarly to the first memory block BLK1.

The memory block BLK1 may include a plurality of cell strings CS1_1 to CS1_$m$ ($m$ is a positive integer). The first to m-th cell strings CS1_1 to CS1_$m$ are connected to the first to m-th bit lines BL1 to BLm, respectively. Each of the first to m-th cell strings CS1_1 to CS1_$m$ includes a drain select transistor DST, a plurality of memory cells MC1 to MCn connected in series (n is a positive integer), and a source select transistor SST.

Gate terminals of the drain select transistors DST included in each of the first to m-th cell strings CS1_1 to CS1_$m$ are connected to a drain select line DSL1. Gate terminals of the first to n-th memory cells MC1 to MCn included in each of the first to m-th cell strings CS1_1 to CS1_$m$ are connected to the first to n-th word lines WL1 to WLn, respectively. Gate terminals of the source select transistors SST included in each of the first to m-th cell strings CS1_1 to CS1_$m$ are connected to a source select line SSL1.

For convenience of description, a structure of the cell string will be described with reference to the first cell string CS1_1 of the plurality of cell strings CS1_1 to CS1_$m$. However, it will be understood that each of the remaining cell strings CS1_2 to CS1_$m$ is configured similarly to the first cell string CS1_1.

A drain terminal of the drain select transistor DST included in the first cell string CS1_1 is connected to the first bit line BL1. A source terminal of the drain select transistor DST included in the first cell string CS1_1 is connected to a drain terminal of the first memory cell MC1 included in the first cell string CS1_1. The first to n-th memory cells MC1 to MCn are connected in series with each other. A drain terminal of the source select transistor SST included in the first cell string CS1_1 is connected to a source terminal of the n-th memory cell MCn included in the first cell string CS1_1. A source terminal of the source select transistor SST included in the first cell string CS1_1 is connected to a common source line CSL. As an embodiment, the common source line CSL may be commonly connected to the first to z-th memory blocks BLK1 to BLKz.

The drain select line DSL1, the first to n-th word lines WL1 to WLn, and the source select line SSL1 are included in row lines RL of FIG. 2. The drain select line DSL1, the first to n-th word lines WL1 to WLn, and the source select line SSL1 are controlled by the address decoder 121. The common source line CSL is controlled by the control logic 130. The first to m-th bit lines BL1 to BLm are controlled by the read and write circuit 123.

Figure 3:
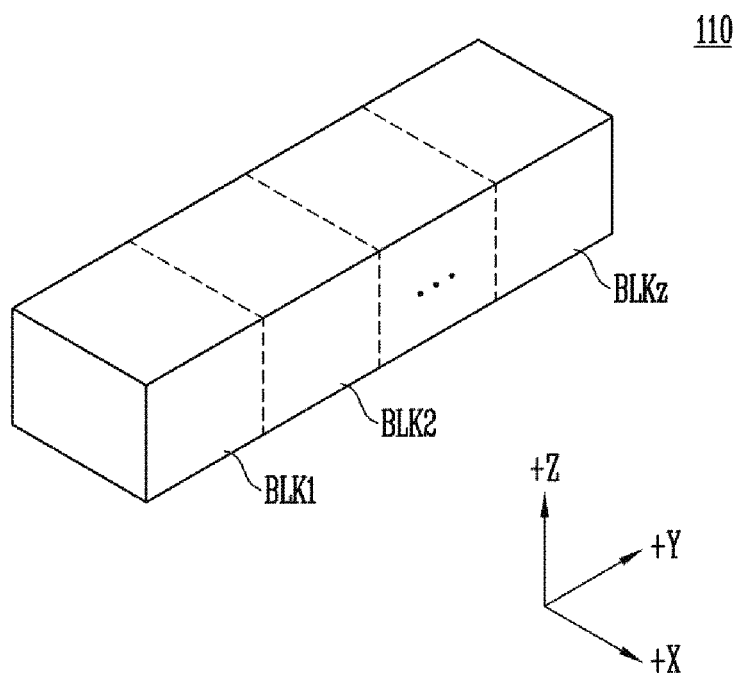
FIG. 3 is a diagram for describing another embodiment of the memory cell array of FIG. 1.

FIG. 3 is a diagram for describing another embodiment of the memory cell array of FIG. 1.

Referring to FIG. 3, the memory cell array 110 includes a plurality of memory blocks BLK1 to BLKz. Each memory block has a three-dimensional structure. Each memory block includes a plurality of memory cells stacked on a substrate. Such plurality of memory cells are arranged along a +X direction, a +Y direction, and a +Z direction. A structure of each memory block is described in more detail with reference to FIGS. 4 and 5.

Figure 4:
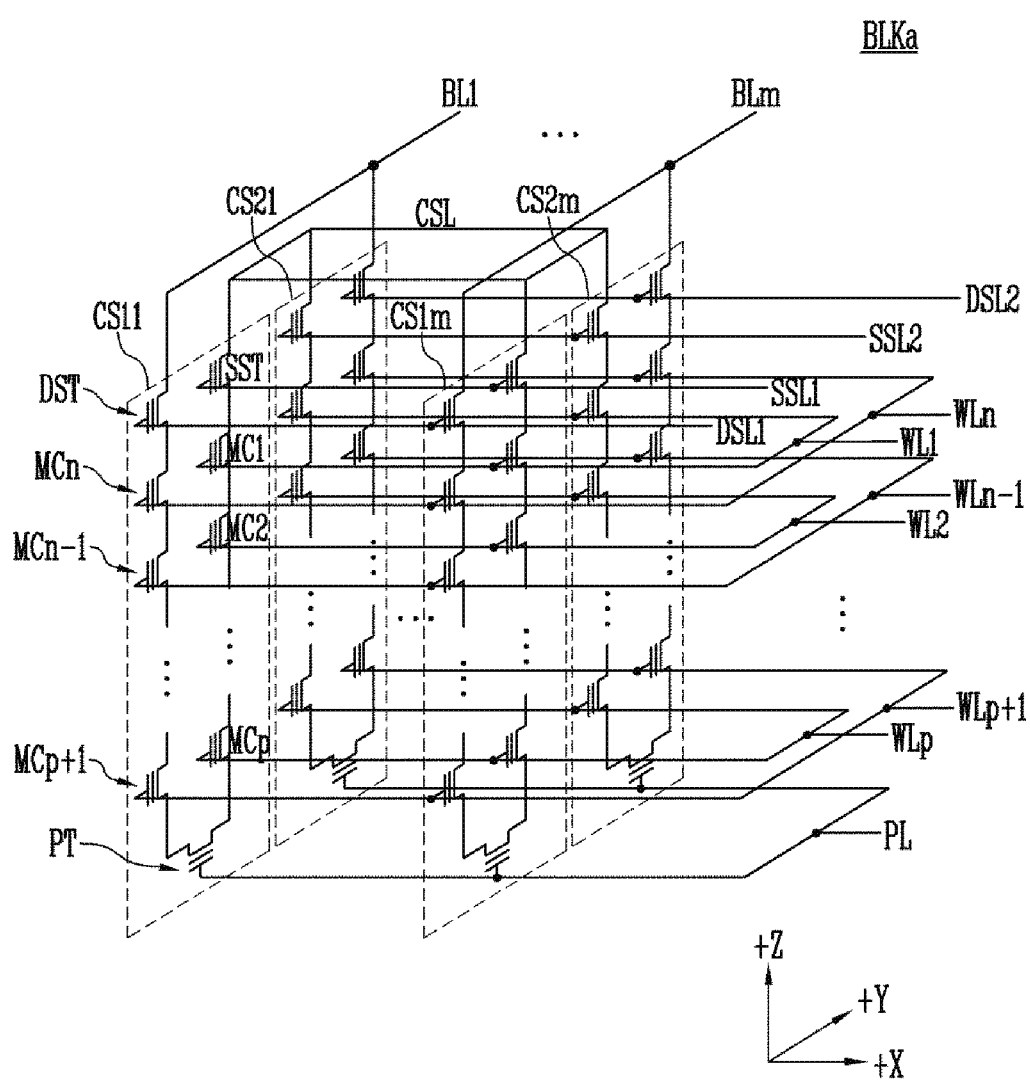
FIG. 4 is a circuit diagram illustrating any one memory block BLKa of memory blocks BLK1 to BLKz of FIG. 3.

FIG. 4 is a circuit diagram illustrating any one memory block BLKa of the memory blocks BLK1 to BLKz of FIG. 3.

Referring to FIG. 4, the memory block BLKa includes a plurality of cell strings CS11 to CS1m and CS21 to CS2m. As an embodiment, each of the plurality of cell strings CS11 to CS1m and CS21 to CS2m may be formed in a shape. In the memory block BLKa, m cell strings are arranged in a row direction (that is, the +X direction). In FIG. 4, two cell strings are arranged in a column direction (that is, the +Y direction). However, this is for convenience of description and it may be understood that three or more cell strings may be arranged in the column direction.

In an embodiment, one memory block may include a plurality of sub blocks. One sub block may include cell strings arranged in a 'U' shape in one column.

Each of the plurality of cell strings CS11 to CS1m and CS21 to CS2m includes at least one source select transistor SST, first to n-th memory cells MC1 to MCn, a pipe transistor PT, and at least one drain select transistor DST.

Each of the select transistors SST and DST and the memory cells MC1 to MCn may have a similar structure. As an embodiment, each of the select transistors SST and DST and the memory cells MC1 to MCn may include a channel layer, a tunneling insulating film, a charge storage film, and a blocking insulating film. As an embodiment, a pillar for providing the channel layer may be provided in each cell string. As an embodiment, a pillar for providing at least one of the channel layer, the tunneling insulating film, the charge storage film, and the blocking insulating film may be provided in each cell string.

The source select transistor SST of each cell string is connected between a common source line CSL and the memory cells MC1 to MCp.

As an embodiment, the source select transistors of the cell strings arranged in the same row are connected to a source select line extending in the row direction, and the source select transistors of the cell strings arranged in different rows are connected to different source select lines. In FIG. 4, the source select transistors of the cell strings CS11 to CS1m of a first row are connected to a first source select line SSL1. The source select transistors of the cell strings CS21 to CS2m of a second row are connected to a second source select line SSL2.

As another embodiment, the source select transistors of the cell strings CS11 to CS1m and CS21 to CS2m may be commonly connected to one source select line.

The first to n-th memory cells MC1 to MCn of each cell string are connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp are sequentially arranged in a direction opposite to the +Z direction, and are connected in series between the source select transistor SST and the pipe transistor PT. The (p+1)-th to n-th memory cells MCp+1 to MCn are sequentially arranged in the +Z direction, and are connected in series between the pipe transistor PT and the drain select transistor DST. The first to p-th memory cells MC1 to MCp and the (p+1)-th to n-th memory cells MCp+1 to MCn are connected to each other through the pipe transistor PT. Gates of the first to n-th memory cells MC1 to MCn of each cell string are connected to the first to n-th word lines WL1 to WLn, respectively.

A gate of the pipe transistor PT of each cell string is connected to a pipeline PL.

The drain select transistor DST of each cell string is connected between a corresponding bit line and the memory cells MCp+1 to MCn. The cell strings arranged in the row direction are connected to the drain select line extending in the row direction. The drain select transistors of the cell strings CS11 to CS1m of the first row are connected to a first drain select line DSL1. The drain select transistors of the cell strings CS21 to CS2m of the second row are connected to a second drain select line DSL2.

The cell strings arranged in the column direction are connected to the bit lines extending in the column direction. In FIG. 4, the cell strings CS11 and CS21 of the first column are connected to the first bit line BL1. The cell strings CS1m and CS2m of the m-th column are connected to the m-th bit line BLm.

The memory cells connected to the same word line in the cell strings arranged in the row direction configure one page. For example, the memory cells connected to the first word line WL1, among the cell strings CS11 to CS1m of the first row configure one page. The memory cells connected to the first word line WL1, among the cell strings CS21 to CS2m of the second row configure another page. The cell strings arranged in one row direction may be selected by selecting any one of the drain select lines DSL1 and DSL2. One page of the selected cell strings may be selected by selecting any one of the word lines WL1 to WLn.

As another embodiment, even bit lines and odd bit lines may be provided instead of the first to m-th bit lines BL1 to BLm. In addition, even-numbered cell strings among the cell strings CS11 to CS1m or CS21 to SC2m arranged in the row direction may be connected to the even bit lines, and odd-numbered cell strings among the cell strings CS11 to CS1m or CS21 to CS2m arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCp. Alternatively, at least one dummy memory cell is provided to reduce an electric field between the drain select transistor DST and the memory cells MCp+1 to MCn. As more dummy memory cells are provided, reliability of an operation for the memory block BLKa is improved, however, the size of the memory block BLKa increases. As less dummy memory cells are provided, the size of the memory block BLKa may be reduced, however, the reliability of the operation for the memory block BLKa may be reduced.

In order to efficiently control at least one dummy memory cell, each of the dummy memory cells may have a required threshold voltage. Before or after an erase operation for the memory block BLKa, program operations for all or a part of the dummy memory cells may be performed. When the erase operation is performed after the program operation is performed, the dummy memory cells may have the required threshold voltage by controlling a voltage applied to dummy word lines connected to the respective dummy memory cells.

Figure 5:
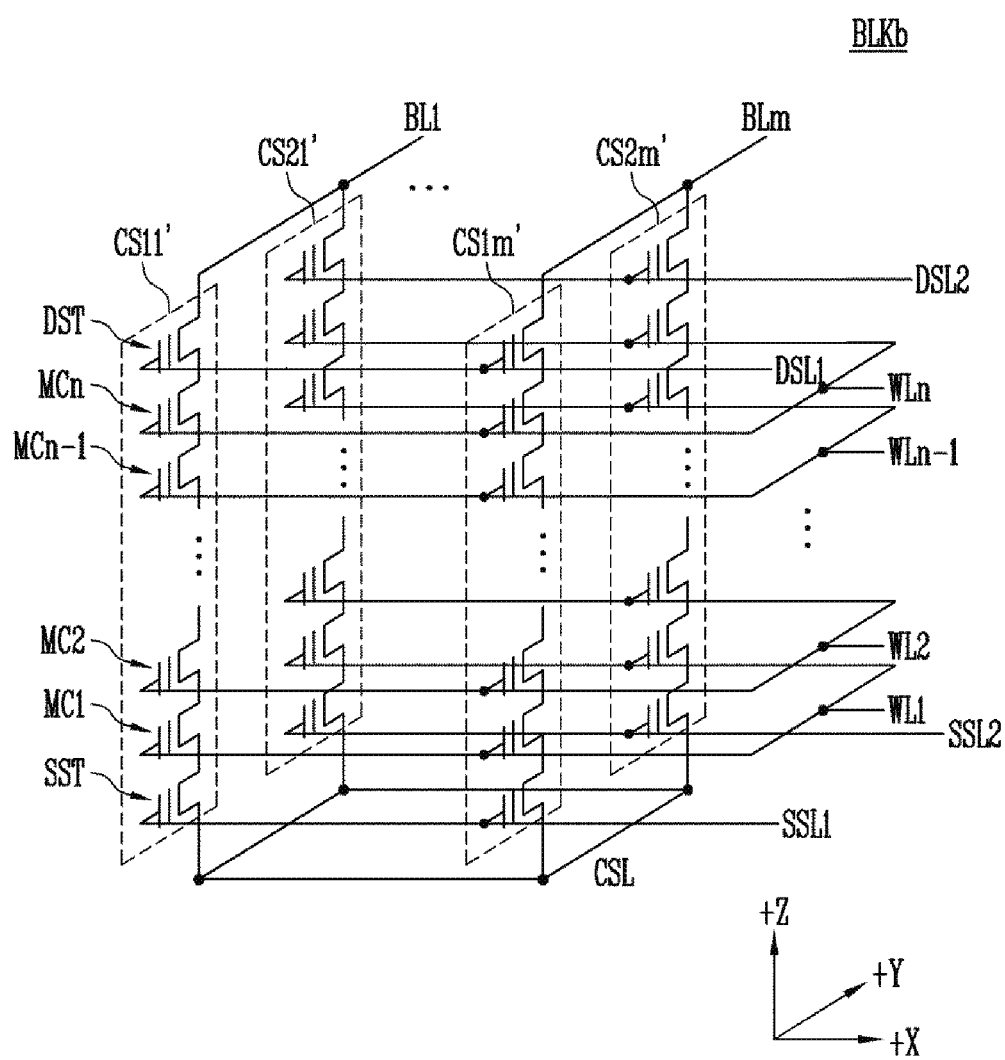
FIG. 5 is a circuit diagram illustrating another embodiment of any one memory block BLKb of the memory blocks BLK1 to BLKz of FIG. 3.

FIG. 5 is a circuit diagram illustrating another embodiment of any one memory block BLKb of the memory blocks BLK1 to BLKz of FIG. 3.

Referring to FIG. 5, the memory block BLKb includes a plurality of cell strings CS11' to CS1m' and CS21' to CS2m'. Each of the plurality of cell strings CS11' to CS1m' and CS21' to CS2m' extends along a +Z direction. Each of the plurality of cell strings CS11' to CS1m' and CS21' to CS2m' includes at least one source select transistor SST, first to n-th memory cells MC1 to MCn, and at least one drain select transistor DST stacked on a substrate (not shown) under the memory block BLKb.

In an embodiment, one memory block may include a plurality of sub blocks. One sub block may include cell strings arranged in an 'I' shape in one column.

The source select transistor SST of each cell string is connected between a common source line CSL and memory cells MC1 to MCn. The source select transistors of the cell strings arranged in the same row are connected to the same source select line. The source select transistors of the cell strings CS11' to CS1m' arranged in a first row are connected to a first source select line SSL1. The source select transistors of the cell strings CS21' to CS2m' arranged in a second row are connected to a second source select line SSL2. As another embodiment, the source select transistors of the cell strings CS11' to CS1m' and CS21' to CS2m' may be commonly connected to one source select line.

The first to n-th memory cells MC1 to MCn of each cell string are connected in series between the source select transistor SST and the drain select transistor DST. Gates of the first to n-th memory cells MC1 to MCn are connected to first to the n-th word lines WL1 to WLn, respectively.

The drain select transistor DST of each cell string is connected between a corresponding bit line and the memory cells MC1 to MCn. The drain select transistors of the cell strings arranged in the row direction are connected to a drain select line extending in the row direction. The drain select transistors of the cell strings CS11' to CS1m' of a first row are connected to a first drain select line DSL1. The drain select transistors of the cell strings CS21' to CS2m' of a second row are connected to a second drain select line DSL2.

As a result, the memory block BLKb of FIG. 5 has an equivalent circuit similar to the memory block BLKa of FIG. 4 except that the pipe transistor PT is excluded from each cell string.

As another embodiment, even bit lines and odd bit lines may be provided instead of the first to m-th bit lines BL1 to BLm. In addition, even-numbered cell strings among the cell strings CS11' to CS1m' or CS21' to CS2m' arranged in the row direction may be connected to even bit lines, and odd-numbered cell strings among the cell strings CS11' to CS1m' or CS21' to CS2m' arranged in the row direction may be connected to odd bit lines, respectively.

As an embodiment, at least one of the first to n-th memory cells MC1 to MCn may be used as a dummy memory cell. For example, at least one dummy memory cell is provided to reduce an electric field between the source select transistor SST and the memory cells MC1 to MCn. Alternatively, at least one dummy memory cell is provided to reduce an electric field between the drain select transistor DST and the memory cells MC1 to MCn. As more dummy memory cells are provided, reliability of an operation for the memory block BLKb is improved, however, the size of the memory block BLKb increases. As less dummy memory cells are provided, the size of the memory block BLKb may be reduced, however, the reliability of the operation for the memory block BLKb may be reduced.

In order to efficiently control at least one dummy memory cell, each of the dummy memory cells may have a required threshold voltage. Before or after an erase operation for the memory block BLKb, program operations for all or a part of the dummy memory cells may be performed. When the erase operation is performed after the program operation is performed, the dummy memory cells may have the required threshold voltage by controlling a voltage applied to the dummy word lines connected to the respective dummy memory cells.

Figure 6:
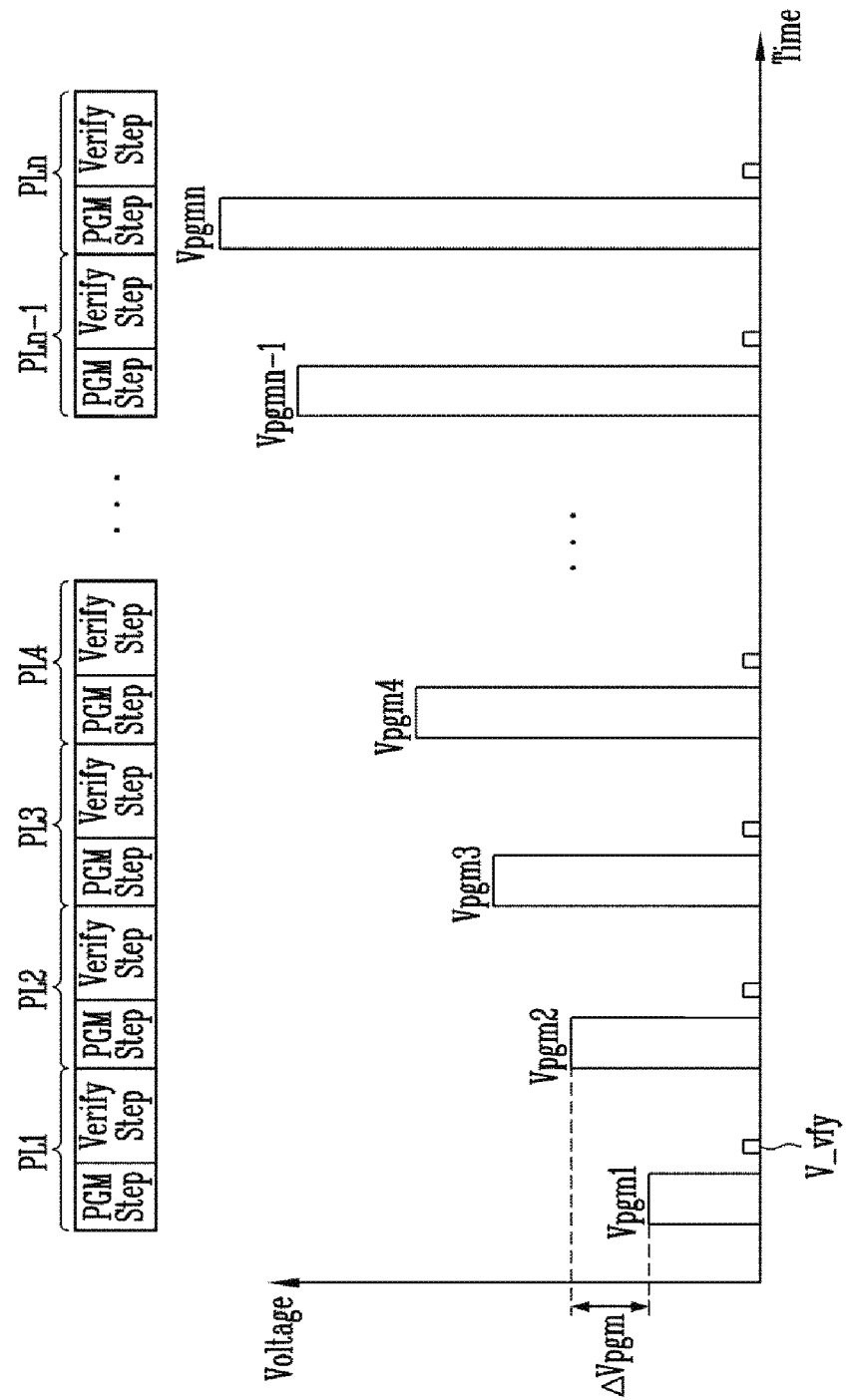
FIG. 6 is a diagram for describing a program operation according to an embodiment.

FIG. 6 is a diagram for describing a program operation according to an embodiment.

In FIG. 6, for convenience of description, it is assumed that each of the plurality of memory cells is a single level cell (SLC) that stores 1-bit data. However, the scope of the present disclosure is not limited thereto, and each of the plurality of memory cells may be a multi-level cell (MLC) that stores 2-bit data, a triple level cell (TLC) that stores 3-bit data, or a quad level cell (QLC) that stores 4-bit data.

The program operation of the memory device may include a plurality of program loops PL1 to PLn. That is, the memory device may perform the plurality of program loops PL1 to PLn to program selected memory cells to have a threshold voltage corresponding to a program state. In an embodiment, when the number of data bits stored in the memory cell is equal to or greater than 2, the memory device may perform the plurality of program loops PL1 to PLn to program the selected memory cells to have the threshold voltage corresponding to any one program state among a plurality of program states.

Each of the plurality of program loops PL1 to PLn may include a program step PGM Step and a verify step Verify Step.

In the program step PGM Step, a program voltage may be applied to a selected word line connected to the selected memory cells. In the program step PGM Step, a program permission voltage or a program inhibit voltage may be applied to a bit line connected to a program target cell among the selected memory cells. The program inhibit voltage may be applied to a bit line connected to a non-program target cell among the selected memory cells.

For example, the program permission voltage may be applied to a program permission bit line connected to a program permission cell among the program target cells. The program inhibit voltage may be applied to a program inhibit bit line connected to a program inhibit cell among the program target cells. In an embodiment, the program permission voltage may be a ground voltage. In an embodiment, the program inhibit voltage may be a power voltage.

In the verify step Verify Step, it may be determined whether the memory cells are programmed by applying verify voltages to the selected word line.

For example, when the first program loop PL1 is performed, a verify voltage V_vfy is applied to verify the program state of a plurality of memory cells after a first program pulse Vpgm1 is applied.

The memory cells of which the verification is passed by the verify voltage V_vfy may be determined to have a target program state, and then may be program inhibited in the second program loop PL2. In the second program loop PL2, a second program pulse Vpgm2 greater than the first program pulse Vpgm1 by a unit voltage ΔVpgm is applied. Thereafter, the verify operation is performed identically to the verify operation of the first program loop PL1. For example, a verify pass indicates that the memory cell is determined as an off-cell by the corresponding verify voltage.

During the verify operation, the verify voltage may be applied to a selected word line, which is a word line to which the selected memory cells are connected, and the page buffer of FIG. 1 may determine whether the verification of the memory cells is passed based on a current flowing through the bit lines connected to the selected memory cells or a voltage applied to the bit line.

Figure 7:
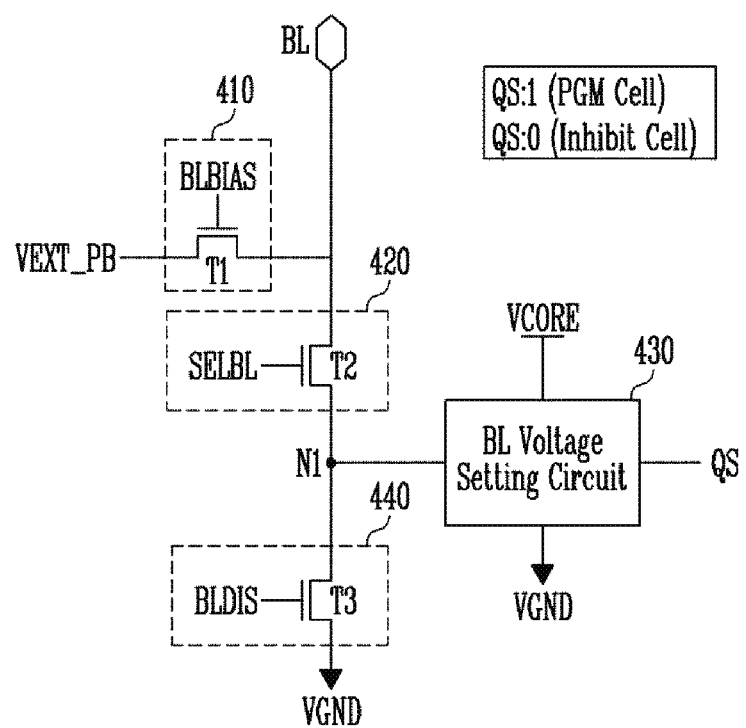
FIG. 7 is a diagram for describing a page buffer of FIG. 1.

FIG. 7 is a diagram for describing the page buffer of FIG. 1.

Referring to FIG. 7, the page buffer may include a first transistor 410, a second transistor 420, and a bit line voltage setting circuit 430. The page buffer may further include a third transistor 440. The page buffer may additionally include a latch (not drawn).

The first transistor 410 may connect the bit line BL and an input power node VEXT_PB to each other. The first transistor 410 may be controlled according to a first control signal BLBIAS. The first control signal BLBIAS may be a bit line bias control signal for transferring an input voltage applied to the input power node VEXT_PB to the bit line BL.

In an embodiment, voltages of various levels may be applied to the input power node VEXT_PB. For example, an internal power voltage VCORE may be applied to the input power node VEXT_PB. An external power voltage VCCE may be applied to the input power node VEXT_PB. An erase voltage VERASE may be applied to the input power node VEXT_PB. An external voltage VEXT_PAD input through an external pad may be applied to the input power node VEXT_PB. A type of the voltage applied to the input power node VEXT_PB is not limited to the present embodiments.

The second transistor 420 may connect the bit line BL and a common bit line node N1 to each other. The second transistor 420 may be controlled according to a second control signal SELBL. The second control signal SELBL may be a bit line selection signal for connecting the bit line BL and the common bit line node N1 to each other.

The bit line voltage setting circuit 430 may pre-charge a potential of the common bit line node N1 to the internal power voltage VCORE or discharge the potential of the common bit line node N1 to a ground voltage VGND according to data QS stored in a latch.

For example, when a value of the data QS is '0', the bit line voltage setting circuit 430 may pre-charge the potential of the common bit line node N1 to the internal power voltage VCORE. When the value of the data QS is '1', the bit line voltage setting circuit 430 may discharge the potential of the common bit line node N1 to the ground voltage VGND.

The third transistor 440 may connect the common bit line node N1 and a ground voltage node to each other. The third transistor 440 may be controlled according to a third control signal BLDIS. The third control signal BLDIS may be a bit line discharge signal for discharging the bit line BL to the ground voltage VGND.

In an embodiment, when the selected memory cell is the program target cell, the value of the data QS stored in the latch may be '0' or '1' according to a program verification result. For example, when the selected memory cell is the program permission cell among the program target cells, the value of the data QS stored in the latch may be '1'. When the selected memory cell is the program inhibit cell among the program target cells, the value of the data QS stored in the latch may be '0'.

In an embodiment, when the selected memory cell is the non-program target cell, the value of the data QS stored in the latch may be '0'. However, the value of the data QS stored in the latch in a first step of a bit line setup step described with reference to FIG. 9 may be inverted from '0' to '1'.

Figure 8:
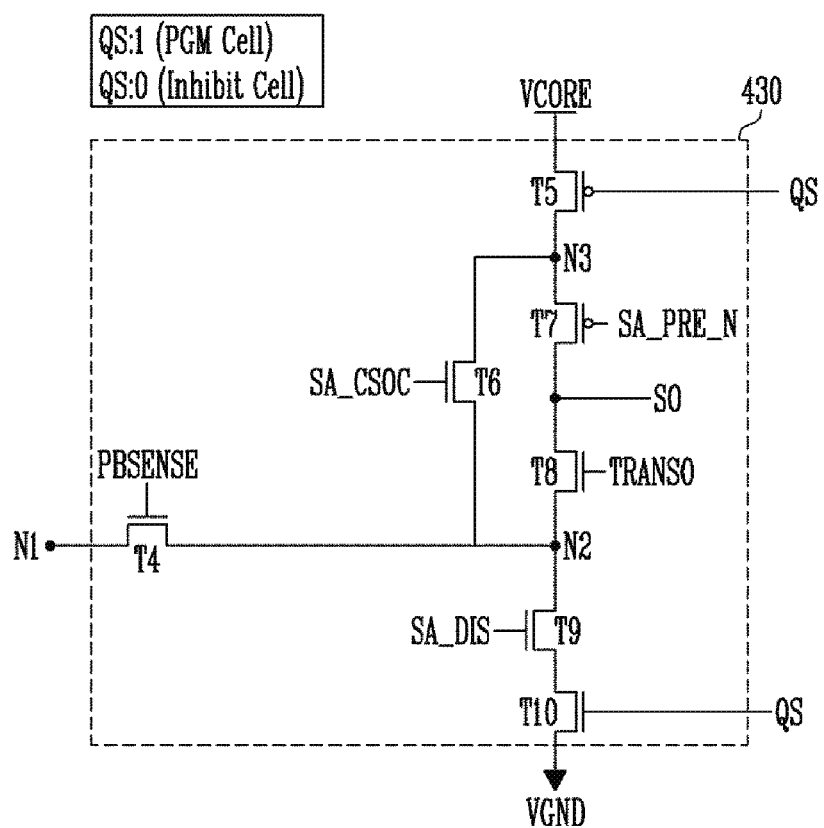
FIG. 8 is a diagram for describing a bit line voltage setting circuit of FIG. 7.

FIG. 8 is a diagram for describing the bit line voltage setting circuit of FIG. 7.

Referring to FIG. 8, the bit line voltage setting circuit 430 may include fourth to tenth transistors T4 to T10. The number of transistors included in the bit line voltage setting circuit is not limited to the present embodiments.

The fourth transistor T4 may connect the common bit line node N1 and a node N2 to each other and may be controlled according to a fourth control signal PBSENSE.

The fifth transistor T5 may connect an internal power node to which the internal power voltage VCORE is input and a node N3 to each other, and may be controlled according to a fifth control signal. The fifth control signal may be a value of the data QS stored in the latch.

The sixth to eighth transistors T6 to T8 may be connected between the node N3 and the node N2. The sixth transistor T6 may connect the node N3 and the node N2 to each other and may be controlled according to a sixth control signal SA_CSOC. The seventh transistor T7 may connect the node N3 and a node SO to each other and may be controlled according to a seventh control signal SA_PRE_N. The eighth transistor T8 may connect the node SO and the node N2 to each other and may be controlled according to an eighth control signal TRANSO.

The ninth and tenth transistors T9 and T10 may be connected in series between the node N2 and a ground node to which the ground voltage VGND is input. The ninth transistor T9 may be controlled according to a ninth control signal SA_DIS, and the tenth transistor T10 may be controlled according to a tenth control signal. The tenth control signal may be the value of the data QS stored in the latch.

In an embodiment, when the value of the data QS stored in the latch is '1', the tenth transistor T10 may be turned on and the fifth transistor T5 may be turned off. As the fourth and ninth transistors T4 and T9 are turned on, the potential of the common bit line node N1 may be discharged to the ground voltage VGND.

In an embodiment, when the value of the data QS stored in the latch is '0', the tenth transistor T10 may be turned off and the fifth transistor T5 may be turned on. As the fourth and sixth transistors T4 and T6 are turned on, the potential of the common bit line node N1 may be pre-charged to the internal power voltage VCORE.

Figure 9:
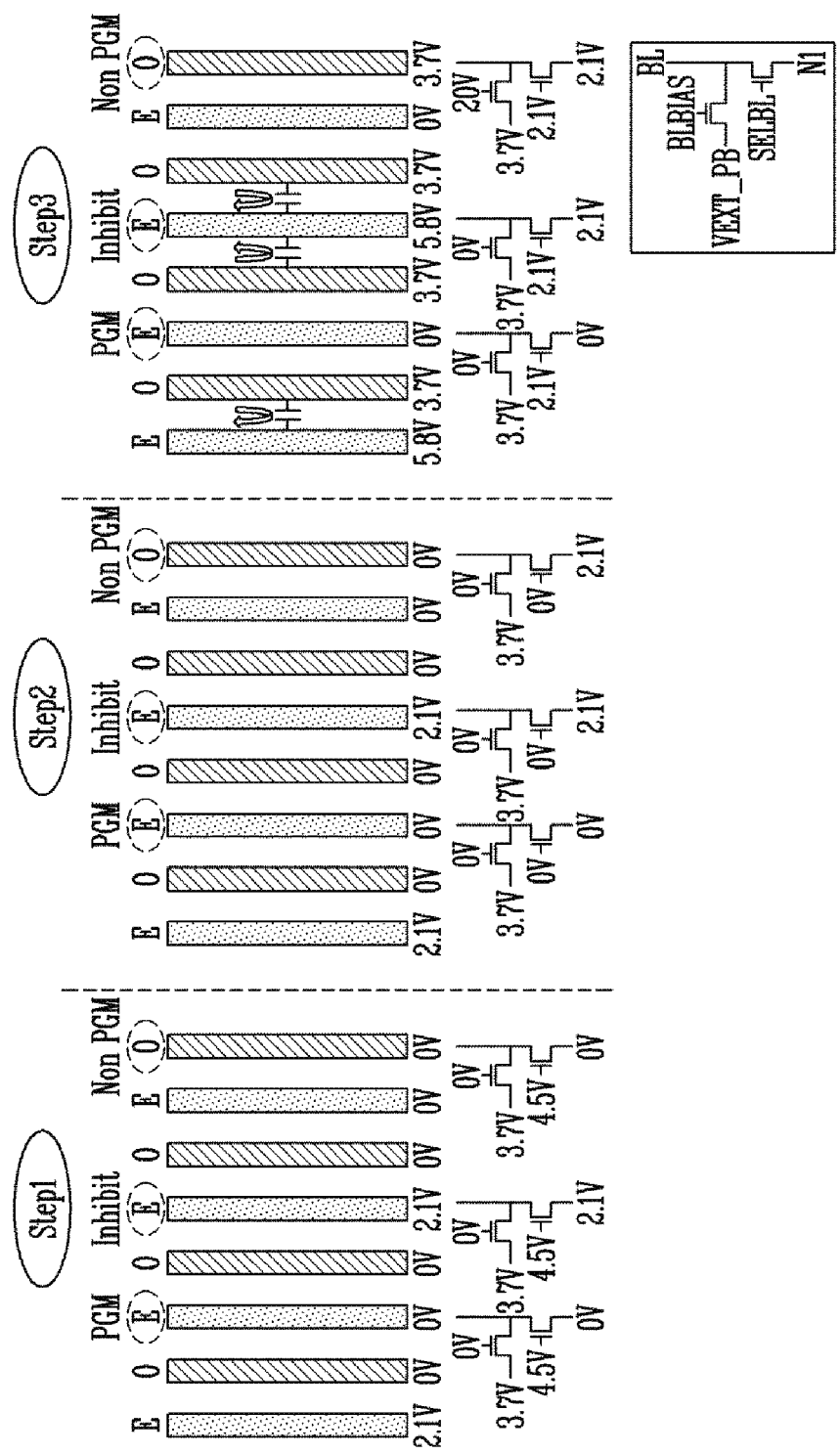
FIG. 9 is a diagram for describing a bit line setup operation according to an embodiment.

FIG. 9 is a diagram for describing the bit line setup operation according to an embodiment.

Referring to FIG. 6, the program operation may include the program step PGM Step and the verify step Verify Step. The program step PGM Step includes a bit line voltage setup step in which the bit line setup operation is performed and a program pulse application step in which a program voltage application operation is performed.

The program operation may be a program operation for the drain select transistors connected to the drain select line described with reference to FIGS. 2 to 5.

For example, the program operation may be an operation for the first drain select transistors connected to the first bit lines among the drain select transistors connected to the drain select line. The first drain select transistors may be the program target cells. The second drain select transistors connected to the second bit lines among the drain select transistors connected to the drain select line may be the non-program target cells.

In other words, the bit lines connected to the program target cells may be the first bit lines. The bit line connected to the program permission cell among the program target cells may be the program permission bit line among the first bit lines. The bit line connected to the program inhibit cell among the program target cells may be the program inhibit bit line among the first bit lines. The bit lines connected to the non-program target cells may be the second bit lines.

In FIG. 9, it is assumed that the first bit lines are even bit lines, and the second bit lines are odd bit lines. In another embodiment, the first bit lines may be odd bit lines, and the second bit lines may be even bit lines.

In an embodiment, the program target cell may be divided into the program permission cell or the program inhibit cell. For example, the program target cell may be determined as the program permission cell or the program inhibit cell according to the program verification result for the program target cell. For example, when the threshold voltage of the program target cell is less than the verify voltage, the program target cell may be determined as the program permission cell. When the threshold voltage of the program target cell is greater than or equal to the verify voltage, the program target cell may be determined as the program inhibit cell.

In an embodiment, each of the first bit lines and the second bit lines may be connected to the page buffer.

Referring to FIG. 7, the first transistor in the page buffer may connect the input power node VEXT_PB and the bit line BL to each other and may be controlled according to the first control signal BLBIAS. The second transistor in the page buffer may connect the bit line BL and the common bit line node N1 to each other and may be controlled according to the second control signal SELBL. The potential of the common bit line node N1 in the page buffer may be set to the internal power voltage or the ground voltage according to the data stored in the latch.

In an embodiment, the first transistors of the page buffers connected to the first bit lines may be controlled by a control signal BLBIAS_E. The second transistors of the page buffers connected to the first bit lines may be controlled by the second control signal SELBL.

The first transistors of the page buffers connected to the second bit lines may be controlled by a control signal BLBIAS_O. The second transistors of the page buffers connected to the second bit lines may be controlled by the second control signal SELBL.

The potential of the common bit line node N1 may be set differently for each page buffer.

In FIG. 9, it is assumed that the internal power voltage is 2.1V. It is assumed that the input voltage applied to the input power node VEXT_PB is 3.7V. It is assumed that the ground voltage is 0V. However, a level of the power voltage is not limited to the present embodiments.

The bit line setup step may include first to third steps Step 1 to Step 3.

In Step 1, a level of the control signal BLBIAS_E of the first control signal BLBIAS may be 0V, and a level of the control signal BLBIA S_O may be 0V. A level of the second control signal SELBL may be a first turn on voltage Von1 sufficient to turn on the second transistor. In FIG. 9, a level of the first turn on voltage Von1 may be 4.5V. However, the level of the first turn on voltage Von1 is not limited to the present embodiments.

For example, the potential of the common bit line node may be set to 0V in the first page buffer connected to the program permission bit line. Since the level of the control signal BLBIAS_E is 0V in the first page buffer, the first transistor may be turned off. Since the level of the second control signal is 4.5V in the first page buffer, the second transistor may be turned on. Therefore, 3.7V applied to the input power node might not be transferred to the program permission bit line, and 0V applied to the common bit line node may be transferred to the program permission bit line.

The potential of the common bit line node may be set to 2.1V in the second page buffer connected to the program inhibit bit line. Since the level of the control signal BLBIAS_E is 0V in the second page buffer, the first transistor may be turned off. Since the level of the second control signal is 4.5V in the second page buffer, the second transistor may be turned on. Therefore, 3.7V applied to the input power node might not be transferred to the program inhibit bit line, and 2.1V applied to the common bit line node may be transferred to the program inhibit bit line.

The potential of the common bit line node line may be set to 0V in the third page buffer connected to the second bit line. Since the level of the control signal BLBIAS_O is 0V in the third page buffer, the first transistor may be turned off. Since the level of the second control signal is 4.5V in the third page buffer, the second transistor may be turned on. Therefore, 3.7V might not transferred to the second bit line, and 0V applied to the common bit line node may be transferred to the second bit line.

Therefore, in Step 1, the potential of the program permission bit line may be set to 0V, which is the ground voltage. The potential of the program inhibit bit line may be pre-charged to 2.1V. The potential of the second bit lines may be set to 0V, which is the ground voltage.

In Step 2, the level of the control signal BLBIAS_E of the first control signal BLBIAS may be 0V, and the level of the control signal BLBIAS_O may be 0V. Therefore, the level of the first control signal BLIBAS may be the same as that of Step 1. The level of the second control signal SELBL may be 0V, which is the ground voltage. Therefore, the level of the second control signal SELBL may be transited from 4.5V to 0V in comparison with Step 1. In comparison with Step 1, the potential of the common bit line node of the third page buffer may be pre-charged from 0V to 2.1V.

For example, in the first page buffer, the first transistor is turned off, and 3.7V applied to the input power node is not transferred to the program permission bit line. In the first page buffer, the second transistor is turned off and 0V applied to the common bit line node is not transferred to the program permission bit line. Therefore, the program permission bit line may be floated, and the potential of the program permission bit line may be maintained as 0V applied in Step 1.

In the second page buffer, the first transistor is turned off and 3.7V applied to the input power node is not transferred to the program inhibit bit line. In the second page buffer, the second transistor is turned off and 2.1V applied to the common bit line node is not transferred to the program inhibit bit line. Therefore, the program inhibit bit line may be floated, and the potential of the program inhibit bit line may be maintained as 2.1V applied in Step 1.

In the third page buffer, the first transistor is turned off and 3.7V applied to the input power node is not transferred to the second bit line. In the third page buffer, the second transistor is turned off and 2.1V applied to the common bit line node is not transferred to the second bit line. Therefore, the second bit line may be floated, and the potential of the second bit line may be maintained as 0V applied in Step 1.

Therefore, in Step 2, the potential of the program permission bit line, the potential of the program inhibit bit line, and the potential of the second bit line may be maintained identically to those of Step 1.

In Step 3, the level of the control signal BLBIAS_E of the first control signal BLBIAS may be 0V. The level of the control signal BLBIAS_O of the first control signal BLBIAS may be a second turn on voltage Von2 sufficient to turn on the first transistor. In FIG. 9, the level of the second turn on voltage Von2 may be 20V. However, the level of the second turn on voltage Von2 is not limited to the present embodiments. The level of the second control signal SELBL may be 2.1V which is the internal power voltage. Therefore, the level of the second control signal SELBL may be transited from 0V to 2.1V in comparison with Step 2. The potential of the common bit line node of each of the first to third page buffers may be the same as that of Step 2.

For example, the first transistor of the first page buffer may be turned off. Therefore, 3.7V applied to the input power node might not be transferred to the program permission bit line. The second transistor of the first page buffer may be turned on. Therefore, 0V applied to the common bit line node may be transferred to the program permission bit line. Therefore, the potential of the program permission bit line may be maintained as 0V, which is a ground voltage level.

In the second page buffer, the first transistor is turned off and 3.7V applied to the input power node is not transferred to the program inhibit bit line. In the second page buffer, 2.1V which is the internal power voltage may be equally applied to a gate terminal and a source terminal of the second transistor. Therefore, since a voltage difference between the gate terminal and the source terminal is 0V, the second transistor may be turned off.

As described above, an operation of applying the same voltage as the voltage applied to the gate terminal to the source terminal of the transistor may be a back bias application operation. The second transistor may be turned off through the back bias application operation, and a current flowing from a drain terminal of the transistor to the source terminal may be blocked.

Since the second transistor is turned off, the program inhibit bit line may be floated. The potential of the program inhibit bit line may be increased from 2.1V to 5.8 by a bit line coupling effect. The bit line coupling effect may be caused a fact that the potential of the second bit lines adjacent to the program inhibit bit line is increased from 0V to 3.7V which is the input voltage.

A voltage increase width according to the bit line coupling effect may be determined according to a voltage increase width of the adjacent bit lines and a bit line coupling coefficient. In FIG. 9, for convenience of description, it is assumed that the bit line coupling coefficient is 1. The bit line coupling coefficient is not limited to the present embodiments.

In the third page buffer, the first transistor may be turned on and 3.7V applied to the input power node may be transferred to the second bit line. In the third page buffer, the second transistor may be turned off by the back bias application operation. Therefore, the potential of the second bit line may be pre-charged from 0V to the 3.7V which is the input voltage in comparison with Step 2.

Therefore, in Step 3, the potential of the program permission bit line may be maintained as 0V. The potential of the program inhibit bit line may be increased from 2.1V to 5.8V by the bit line coupling effect. The potential of the second bit line may be pre-charged from 0V to 3.7V.

According to the embodiments of FIG. 9, the potential of the program inhibit bit line may be increased to a first target voltage using the internal power voltage. Thereafter, the potential of the program inhibit bit line may be increased to a second target voltage by using the bit line coupling effect caused by increasing the potential of the second bit lines adjacent to the program inhibit bit line to the input voltage.

Therefore, there is an advantage that the potential of the program inhibit bit line may be set to a level greater than the internal power voltage or the input power voltage, by using the internal power voltage or input power voltage generated in the memory device.

In an embodiment, since the drain select transistor is directly connected to the bit line, channel boosting may be less than that of general memory cells of the memory cell string. Therefore, when the program inhibit voltage is applied to the program inhibit bit line using only the internal power voltage in the program operation for the drain select transistor, a program inhibit voltage of a sufficiently high level might not be applied to the program inhibit bit line.

In order to solve this, the potential of the program inhibit bit line is required to be increased by using a high voltage supplied separately from the outside of the memory device. In this case, a separate circuit or device for receiving the high voltage may be required.

According to the embodiments of FIG. 9, in the program operation for the drain select transistors, there is an advantage that the potential of the program inhibit bit line may be set to a sufficiently high voltage by using voltages generated in the memory device without a separate circuit or device for receiving the high voltage from the outside of the memory device.

Figure 10:
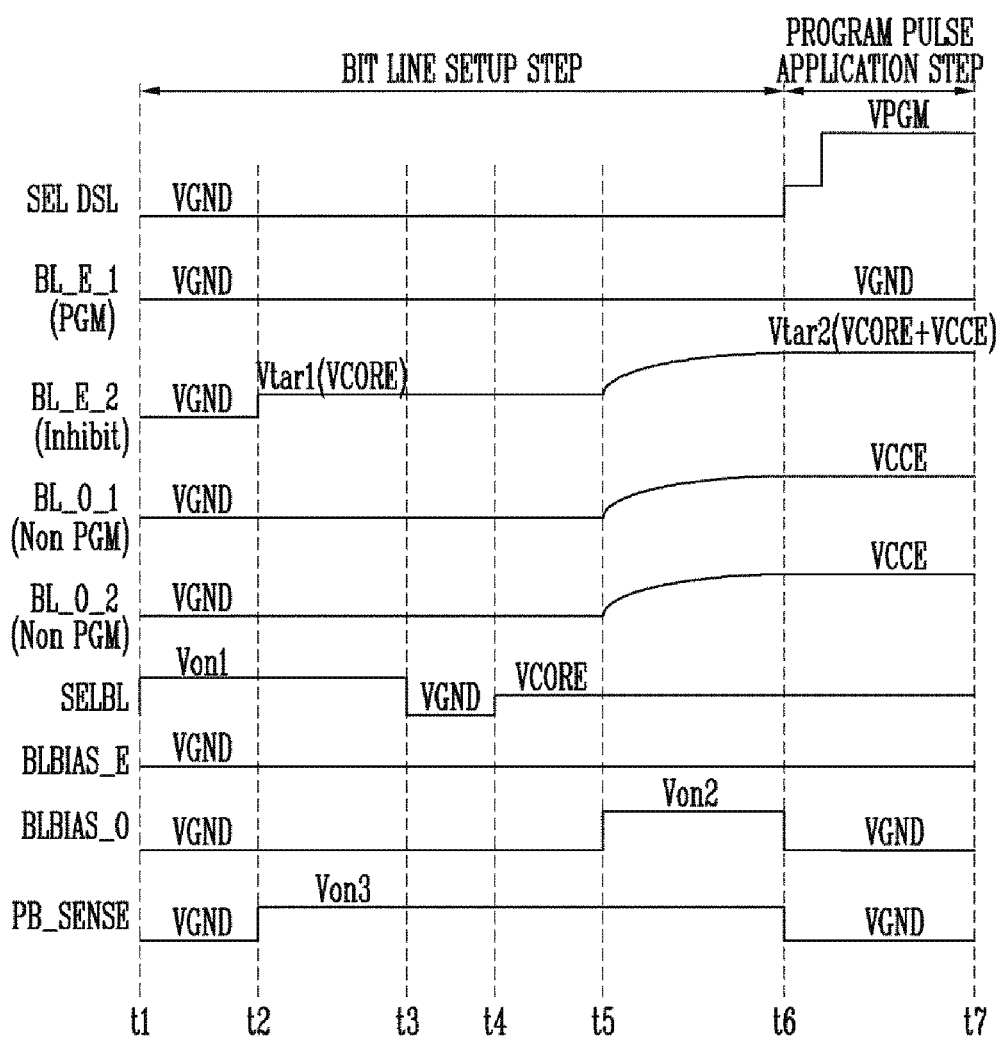
FIG. 10 is a timing diagram for describing the bit line setup operation according to an embodiment.

FIG. 10 is a timing diagram for describing the bit line setup operation according to an embodiment.

Referring to FIGS. 6 and 10, the program operation may include the program step PGM Step and the verify step Verify Step. The program step PGM step includes the bit line voltage setup step in which the bit line setup operation is performed and the program pulse application step in which the program voltage application operation is performed.

In FIG. 10, a program operation on the first drain select transistors connected to the first bit lines among the drain select transistors connected to the drain select line SEL DSL may be performed. The first drain select transistors may be the program target cells. The second drain select transistors connected to the second bit lines among the drain select transistors connected to the drain select line may be the non-program target cells.

In FIG. 10, it is assumed that the first bit lines are even bit lines, and the second bit lines are odd bit lines. In another embodiment, the first bit lines may be odd bit lines, and the second bit lines may be even bit lines.

The bit lines connected to the program target cells may be the first bit lines. The bit line connected to the program permission cell among the program target cells may be a program permission bit line among the first bit lines. The bit line connected to the program inhibit cell among the program target cells may be a program inhibit bit line among the first bit lines. The bit lines connected to the non-program target cells may be second bit lines and BL_O_2.

Referring to FIG. 7, the first transistor in the page buffer may connect the input power node VEXT_PB and the bit line BL to each other and may be controlled according to the first control signal BLBIAS. The second transistor in the page buffer may connect the bit line BL and the common bit line node N1 to each other and may be controlled according to the second control signal SELBL. The potential of the common bit line node N1 in the page buffer may be set to the internal power voltage or the ground voltage according to the data stored in the latch.

In an embodiment, the first transistors of the page buffers connected to the first bit lines may be controlled by the control signal BLBIAS_E. The second transistors of the page buffers connected to the first bit lines may be controlled by the second control signal SELBL.

The first transistors of the page buffers connected to the second bit lines may be controlled by the control signal BLBIAS_O. The second transistors of the page buffers connected to the second bit lines may be controlled by the second control signal SELBL.

In an embodiment, a period t1 to t6 may be the bit line setup step. A period t6 to t7 may be the program pulse application step. In the bit line setup step, the ground voltage VGND may be applied to the drain select line SEL DSL. In the program pulse application step, the program voltage VPGM may be applied to the drain select line SEL DSL.

Referring to FIG. 9, a period t1 to t3 may include Step 1. A period t3 to t4 may include Step 2. A period t4 to t6 may include Step 3.

In the period t1 to t3, the potential of the program inhibit bit line may be increased to a first target voltage Vtar1. A level of the first target voltage Vtar1 may be the internal power voltage level VCORE. The potential of the program permission bit line BL_E_1 may be set to the ground voltage level VGND. The potential of the second bit lines BL_O_1 and BL_O_2 may be set to the ground voltage level VGND.

In the period t3 to t4, the program inhibit bit line BL_E_2 may be floated, and the potential of the program inhibit bit line BL_E_2 may be maintained as the first target voltage Vtar1. The program permission bit line BL_E_1 may be floated, and the potential of the program permission bit line BL_E_1 may be maintained as the ground voltage level VGND. The second bit lines and may be floated, and the potential of the second bit lines BL_O_1 and BL_O_2 may be maintained as the ground voltage level VGND.

In the period t4 to t6, the potential of the program permission bit line may be set to the ground voltage level VGND. The potential of the second bit lines BL_O_1 and BL_O_2 may be increased to the input voltage level. In FIG. 9, the input voltage level may be the external power voltage level VCCE. The input voltage level is not limited to the present embodiments and may have various values.

The potential of the floated program inhibit bit line BL_E_2 may be increased to a second target voltage Vtar2 by the bit line coupling effect caused by a fact that the potential of the second bit lines BL_O_1 and BL_O_2 adjacent to the program inhibit bit line BL_E_2 is increased to the input voltage level.

In an embodiment, the second target voltage Vtar2 may be determined based on the first target voltage Vtar1 and the input voltage. For example, a level of the second target voltage Vtar2 may be a value obtained by adding a value obtained by multiplying the input voltage level by the bit line coupling coefficient and the first target voltage value Vtar1. The bit line coupling coefficient may have a value between 0 and 1. In FIG. 9, it is assumed that the bit line coupling coefficient has a value of 1.

Referring to FIGS. 7 and 9, in the period t1 to t3, the level of the second control signal SELBL may be the first turn on voltage Von1 sufficient to turn on the second transistor of each page buffer. In the period t3 to t4, the level of the second control signal SELBL may be the ground voltage level VGND. In a period t4 to t7, the level of the second control signal SELBL may be the internal power voltage level VCORE.

In a period t1 to t7, the level of the control signal BLBIAS_E applied to the first transistors of the page buffers connected to the first bit lines may be the ground voltage level VGND.

In a period t1 to t5, the level of the control signal BLBIAS_O applied to the first transistors of the page buffers connected to the second bit lines may be the ground voltage level VGND. In the period t5 to t6, the level of the control signal BLBIAS_O may be the second turn on voltage Von2 sufficient to turn on the first transistor. In the period t6 to t7, the level of the control signal BLBIAS_O may be the ground voltage level VGND.

Referring to FIG. 8, the fourth transistor T4 of each page buffer may connect the common bit line node N1 and the node N2 to each other and may be controlled according to the fourth control signal PBSENSE. The internal power voltage or the ground voltage applied to the node N2 may be transferred to the common bit line node N1 according to the fourth control signal PBSENSE.

In the period t1 to t2, the level of the fourth control signal PBSENSE may be the ground voltage level VGND. In a period t2 to t6, the level of the fourth control signal PBSENSE may be a third turn on voltage level Von3 sufficient to turn on the fourth transistor T4. In the period t6 to t7, the level of the fourth control signal PBSENSE may be the ground voltage level VGND.

Figure 11:
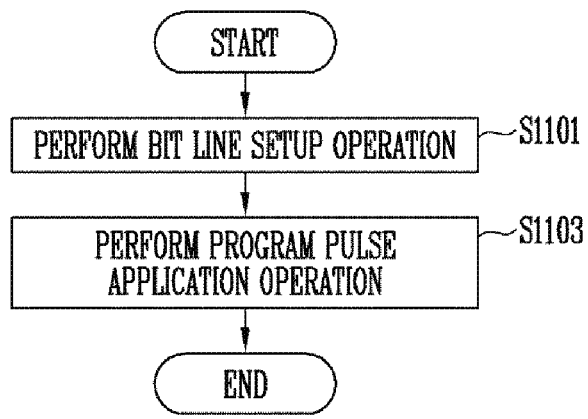
FIG. 11 is a flowchart for describing a program operation.

FIG. 11 is a flowchart for describing the program operation.

Referring to FIGS. 10 and 11, the program operation may include the bit line setup operation and the program pulse application operation. The drain select transistors connected to the drain select line may be connected to the first bit lines and the second bit lines. The program operation may be a program operation for the first drain select transistors connected to the first bit lines among the drain select transistors connected to the drain select line.

In an embodiment, the first bit lines may be even bit lines, and the second bit lines may be odd bit lines. In another embodiment, the first bit lines may be odd bit lines, and the second bit lines may be even bit lines.

In step S1101, the bit line setup operation may be performed. In the bit line setup operation, the potential of the program permission bit line among the first bit lines may be set to the ground voltage level. The potential of the second bit lines may be pre-charged to the program inhibit voltage level. The potential of the program inhibit bit line among the first bit lines may be increased to a voltage level greater than the program inhibit voltage level by using the bit line coupling effect caused by the increase of the potential of the second bit lines.

In step S1103, the program pulse application operation may be performed. The program pulse application operation may be an operation of applying the program voltage to the drain select line connected to the drain select transistors.

Figure 12:
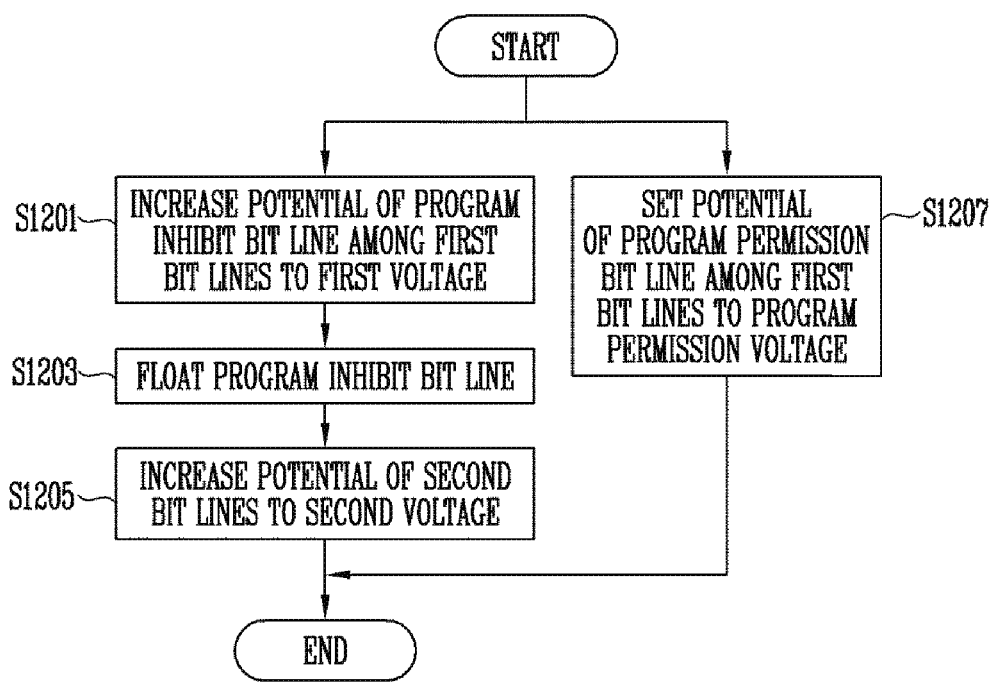
FIG. 12 is a flowchart for describing a bit line setup operation of FIG. 11.

FIG. 12 is a flowchart for describing the bit line setup operation of FIG. 11.

Referring to FIG. 12, in step S1201, the memory device may increase the potential of the program inhibit bit line among the first bit lines to the first voltage. In an embodiment, the first voltage may be the internal power voltage.

In step S1203, the memory device may float the program inhibit bit line.

In step S1205, the memory device may increase the potential of the second bit lines to the second voltage. In an embodiment, the second voltage may be the internal power voltage. In another embodiment, the second voltage may be the external power voltage. While the potential of the second bit lines adjacent to the floated program inhibit bit line is increased to the second voltage, the potential of the program inhibit bit line may be increased from the first voltage to the third voltage by the bit line coupling effect. The third voltage may be determined based on the first voltage and the second voltage. For example, the third voltage value may be a value obtained by adding a value obtained by multiplying the second voltage value by the bit line coupling coefficient and the first voltage value.

In step S1207, the memory device may set the potential of the program permission bit line among the first bit lines to the program permission voltage. In an embodiment, the program permission voltage may be the ground voltage.

Figure 13:
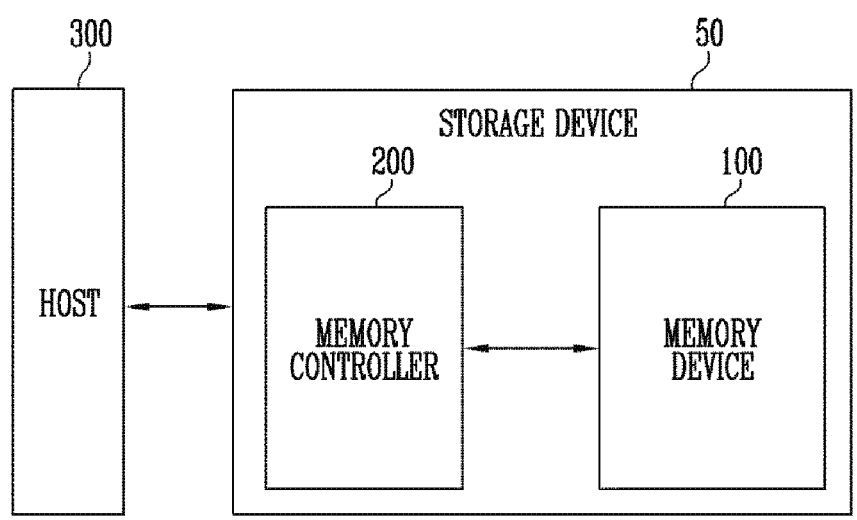
FIG. 13 is a diagram for describing another embodiment of the memory device of FIG. 1.

FIG. 13 is a diagram for describing another embodiment of the memory device of FIG. 1.

Referring to FIG. 13, a storage device 50 may include the memory device 100 and a memory controller 200 controlling an operation of the memory device 100. The storage device 50 is a device that stores data under control of a host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to an interface of the host 300 which is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of package types, such as a package on package (POP), a system in package (SIP), a system on chip (SOC), a multichip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells storing the data.

Each of the memory cells may be configured as a single level cell (SLC) that stores one data bit, a multi-level cell (MLC) that stores two data bits, a triple level cell (TLC) that stores three data bits, or a quad level cell (QLC) that stores four data bits.

The memory cell array may include a plurality of memory blocks. Each of the memory blocks may include a plurality of memory cells. One memory block may include a plurality of pages. In an embodiment, a page may be a unit for storing data in the memory device 100 or reading data stored in the memory device 100.

The memory block may be a unit for erasing data. In an embodiment, the memory device 100 may be a double data rate synchronous dynamic random access memory (DDR SDRAM), a low power double data rate4 (LPDDR4) SDRAM, a graphics double data rate (GDDR) SDRAM, a low power DDR (LPDDR), a Rambus dynamic random access memory (RDRAM), a NAND flash memory, a vertical NAND flash memory, a NOR flash memory device, a resistive random access memory (RRAM), a phase-change memory (PRAM), a magnetoresistive random access memory (MRAM), a ferroelectric random access memory (FRAM), a spin transfer torque random access memory (STT-RAM), or the like. In the present specification, for convenience of description, it is assumed that the memory device 100 is a NAND flash memory.

The memory device 100 is configured to receive a command and an address from the memory controller 200 and access an area selected by the address in the memory cell array. That is, the memory device 100 may perform an operation instructed by the command on the area selected by the address. For example, the memory device 100 may perform a write operation (program operation), a read operation, and an erase operation. During the program operation, the memory device 100 may program data to the area selected by the address. During the read operation, the memory device 100 may read data from the area selected by the address. During the erase operation, the memory device 100 may erase data stored in the area selected by the address.

The memory controller 200 controls overall operations of the storage device 50.

When power is applied to the storage device 50, the memory controller 200 may execute firmware FW. When the memory device 100 is a flash memory device, the memory controller 200 may operate firmware such as a flash translation layer (FTL) for controlling communication between the host 300 and the memory device 100.

In an embodiment, the memory controller 200 may receive data and a logical block address (LBA) from the host 300 and convert the logical block address (LBA) into a physical block address (PBA) indicating an address of memory cells included in the memory device 100 in which data is to be stored.

The memory controller 200 may control the memory device 100 to perform the program operation, the read operation, or the erase operation in response to a request from the host 300. During the program operation, the memory controller 200 may provide a write command, a physical block address, and data to the memory device 100. During the read operation, the memory controller 200 may provide a read command and the physical block address to the memory device 100. During the erase operation, the memory controller 200 may provide an erase command and the physical block address to the memory device 100.

In an embodiment, the memory controller 200 may generate and transmit the command, the address, and the data to the memory device 100 regardless of the request from the host 300. For example, the memory controller 200 may provide a command, an address, and data to the memory device 100 to perform background operations such as a program operation for wear leveling and a program operation for garbage collection.

In an embodiment, the memory controller 200 may control at least two memory devices 100. In this case, the memory controller 200 may control the memory devices 100 according to an interleaving method to improve operation performance. The interleaving method may be an operation method for overlapping operation periods of at least two memory devices 100.

The host 300 may communicate with the storage device 50 using at least one of various communication methods such as a universal serial bus (USB), a serial AT attachment (SATA), a serial attached SCSI (SAS), a high speed intership (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

What is claimed is:

1. A memory device comprising:
   first memory cell strings and second memory cell strings;
   a peripheral circuit connected to first drain select transistors of each of the first memory cell strings through first bit lines, and connected to second drain select transistors of each of the second memory cell strings through second bit lines; and
   control logic configured to control the peripheral circuit to increase a potential of a program inhibit bit line among the first bit lines to a first voltage, float the program inhibit bit line, increase a potential of the second bit lines to a second voltage after the potential of the program inhibit bit line increases to the first voltage, and increase the potential of the floated program inhibit bit line to a third voltage through a bit line coupling effect originated from an increment of the potential of the second bit lines.

2. The memory device of claim 1, wherein the first memory cell strings are alternately positioned with the second memory cell strings.

3. The memory device of claim 1, wherein the peripheral circuit sets a potential of a program permission bit line among the first bit lines to a program permission voltage.

4. The memory device of claim 3, wherein the peripheral circuit comprises:
   a voltage generator configured to generate the first voltage and the second voltage; and
   a read and write circuit configured to set the potential of the first bit lines and the potential of the second bit lines.

5. The memory device of claim 4, wherein the read and write circuit comprises first to third page buffers, and
   each of the first to third page buffers comprises:
   a first transistor connecting a bit line connected to a page buffer and an input power node to each other and controlled according to a first control signal;
   a second transistor connecting the bit line connected to the page buffer and a common bit line node to each other and controlled according to a second control signal; and
   a bit line voltage setting circuit configured to pre-charge a potential of the common bit line node to an internal power voltage or discharge the potential of the common bit line node to a ground voltage according to a program verify result stored in a latch.

6. The memory device of claim 5, wherein a voltage applied to the input power node includes at least one of the first voltage and the second voltage.

7. The memory device of claim 5, wherein the first page buffer is connected to the program permission bit line,
   wherein the second page buffer is connected to the program inhibit bit line, and
   wherein the third page buffer is connected to any one of the second bit lines.

8. The memory device of claim 7, wherein while the potential of the program inhibit bit line increases to the first voltage, the first transistor of each of the first to third page buffers is turned off and the second transistor of each of the first to third page buffers is turned on,
   wherein the bit line voltage setting circuit of each of the first and third page buffers discharges the potential of the common bit line node of each of the first and third page buffers to the ground voltage, and
   wherein the bit line voltage setting circuit of the second page buffer pre-charges the potential of the common bit line node of the second page buffer to the internal power voltage.

9. The memory device of claim 7, wherein while the potential of the second bit lines increases to the second voltage, the first transistor of each of the first and second page buffers is turned off, the first transistor of the third page buffer is turned on, and the second transistor of each of the first to third page buffers is turned on,
   wherein the bit line voltage setting circuit of the first page buffer discharges the potential of the common bit line node of the first page buffer to the ground voltage, and
   wherein the bit line voltage setting circuit of each of the second and third page buffers pre-charges the potential of the common bit line node of each of the second and third page buffers to the internal power voltage.

10. The memory device of claim 9, wherein a level of a voltage for turning on the second transistor of each of the first to third page buffers is the same as a level of the internal power voltage.

11. The memory device of claim 1, wherein the peripheral circuit increases the potential of the floated program inhibit bit line to the third voltage while the potential of the second bit lines increases to the second voltage.

12. The memory device of claim 11, wherein the potential of the floated program inhibit bit line is additionally increased to the third voltage by the bit line coupling effect caused by increasing the potential of the second bit lines to the second voltage.

13. The memory device of claim 11, wherein the second voltage is greater than or equal to the first voltage, and
   the third voltage is determined based on the first voltage and the second voltage.

14. The memory device of claim 13, wherein the third voltage is greater than the second voltage.

15. The memory device of claim 11, wherein the first voltage includes an internal power voltage, and
   wherein the second voltage includes an external power voltage.

16. The memory device of claim 1, wherein the peripheral circuit applies a program pulse to a drain select line connected to the first drain select transistors and the second drain select transistors after the potential of the second bit lines increases to the second voltage.

17. A method of operating a memory device including first memory cell strings and second memory cell strings, the method comprising:

increasing a potential of a program inhibit bit line among first bit lines connected to first drain select transistors of each of the first memory cell strings to a first voltage;

floating the program inhibit bit line;

increasing a potential of second bit lines connected to second drain select transistors of each of the second memory cell strings to a second voltage; and increasing the potential of the floated program inhibit bit line to a third voltage through a bit line coupling effect originated from an increment of the potential of the second bit lines.

18. The method of claim 17, wherein the first memory cell strings are alternately positioned with the second memory cell strings.

19. The method of claim 17, further comprising:

setting a potential of a program permission bit line among the first bit lines to a program permission voltage.

20. The method of claim 17, wherein the potential of the floated program inhibit bit line is increased to the third voltage while the potential of the second bit lines is increased to the second voltage.

21. The method of claim 20, wherein the potential of the floated program inhibit bit line is additionally increased to the third voltage by the bit line coupling effect caused by increasing the potential of the second bit lines to the second voltage.

22. The method of claim 20, wherein the second voltage is greater than or equal to the first voltage, and the third voltage is determined based on the first voltage and the second voltage.

23. The method of claim 22, wherein the third voltage is greater than the second voltage.

24. The method of claim 17, further comprising:

applying a program pulse to a drain select line connected to the first drain select transistors and the second drain select transistors.

25. A memory device comprising:

first memory cell strings and second memory cell strings;

a peripheral circuit connected to first drain select transistors of each of the first memory cell strings through first bit lines, and connected to second drain select transistors of each of the second memory cell strings through second bit lines; and control logic configured to control the peripheral circuit to increase a potential of a program inhibit bit line among the first bit lines from a first voltage to a third voltage by increasing the potential of the program inhibit bit line to the first voltage and increasing the potential of the second bit lines to a second voltage, wherein the peripheral circuit uses a coupling effect originated from an increment of the potential of the second bit lines when increasing the potential of the program inhibit bit line from the first voltage to the third voltage.

* * * * *